US008225656B2

(12) United States Patent
Kato et al.

(10) Patent No.: US 8,225,656 B2
(45) Date of Patent: Jul. 24, 2012

(54) ELECTRICAL DEVICE AND SMOKE DETECTOR

(75) Inventors: Kenichi Kato, Tokyo (JP); Hiroyuki Yokota, Tokyo (JP)

(73) Assignee: Nohmi Bosai Ltd., Tokyo (JP)

( * ) Notice: Subject to any disclaimer, the term of this patent is extended or adjusted under 35 U.S.C. 154(b) by 543 days.

(21) Appl. No.: 12/382,389

(22) Filed: Mar. 16, 2009

(65) Prior Publication Data
US 2009/0241697 A1    Oct. 1, 2009

(30) Foreign Application Priority Data

Mar. 31, 2008 (JP) ................. 2008-089472
Mar. 31, 2008 (JP) ................. 2008-089473
Mar. 31, 2008 (JP) ................. 2008-091049

(51) Int. Cl.
*G01D 11/24* (2006.01)
(52) U.S. Cl. ........................................ 73/431
(58) Field of Classification Search ............. 73/431; 292/80, 95, 340
See application file for complete search history.

(56) References Cited

U.S. PATENT DOCUMENTS

| 3,828,969 | A | 8/1974 | Schurman |
| 5,305,900 | A | 4/1994 | Maguire et al. |
| 5,320,232 | A | 6/1994 | Maguire et al. |
| 6,595,605 | B1 * | 7/2003 | Babcock et al. ........... 312/223.2 |
| 6,769,931 | B2 * | 8/2004 | Negishi et al. ............. 439/404 |
| 6,837,372 | B1 | 1/2005 | Aramaki |
| 2002/0060512 | A1 | 5/2002 | Gan et al. |
| 2004/0173478 | A1 | 9/2004 | Aramaki |

FOREIGN PATENT DOCUMENTS

| DE | 295 18 042 | 1/1996 |
| EP | 1 216 935 | 6/2002 |
| GB | 2 347 541 | 9/2000 |

(Continued)

OTHER PUBLICATIONS

European Search Report (in English language) issued Feb. 25, 2011 in corresponding European Patent Application No. 09 25 0785.

(Continued)

*Primary Examiner* — Hezron E Williams
*Assistant Examiner* — Nathaniel Kolb
(74) *Attorney, Agent, or Firm* — Wenderoth, Lind & Ponack, LLP

(57) ABSTRACT

An electrical device that is free from trouble in opening/closing of the cover even if the housing is distorted. The electric device includes: a case (3) having a substantially box shape and an opened end surface (3a); a cover (5) including a lid surface (5a) for covering the end surface of the case, a hinge (4) arranged between the case and the cover, for opening/closing the case and the cover; and an engagement section (12) for holding a closed state of the case and the cover. The engagement section includes: an engaged portion (7) arranged in the case and including a shaft member (9) having a shaft portion substantially orthogonal to an inner surface of the case, and a bearing member (11) for fixing the shaft member with a distal end (9a) thereof projecting from a guide hole end surface (10a) of a shaft member pushing portion (10); and an engaging portion (19) including a coupling component (20) provided with an attachment piece (23) attached to the cover (5), and a substantially horseshoe shaped portion (27) defining an elongated cutout (25) and connected to an end of the attachment piece.

1 Claim, 9 Drawing Sheets

FOREIGN PATENT DOCUMENTS

| | | |
|---|---|---|
| JP | 60-346 | 1/1985 |
| JP | 6-37988 | 5/1994 |
| JP | 2000-137878 | 5/2000 |
| JP | 2006-31486 | 2/2006 |
| WO | 94/08865 | 4/1994 |

OTHER PUBLICATIONS

Partial European Search Report issued Nov. 24, 2010 in corresponding European Patent Application No. EP 09 25 0785.

* cited by examiner

ELECTRICAL DEVICE AND SMOKE DETECTOR

BACKGROUND OF THE INVENTION

1. Field of the Invention

The present invention relates to an electric device such as fire control panel and the like to be attached to a wall surface and the like, and more particularly, to an open/close structure of a case and a cover of the electric device. Further, the present invention also relates to a smoke detector for optically detecting contaminated material such as smoke floating in air.

2. Description of the Related Art

In an open/close structure of a housing and an upper door of a fire control panel to be attached to the wall surface and the like, a lock mechanism is conventionally used when holding the door of the housing in a closed state. The lock mechanism is provided to the housing and the door so as to fit the housing and the door to each other when the door is closed to perform locking (for example, refer to JP 2520046 B).

On the other hand, a smoke detector is used as a detection system for preventing fire and for detecting smoke emission, or used in semiconductor manufacturing factories, food factories, and the like that require a constant environmental conservation.

This type of smoke detector includes an intake device for taking in air from a monitoring zone through a sampling tube, and a smoke detecting device, to which the air taken in by the intake device is introduced, for detecting smoke particles contained in the introduced air. In the conventional smoke detector, the smoke detecting device and the intake device are incorporated in the main body of the smoke detector, communicated through an intermediation of a long piping to each other, and arranged spaced apart from each other within the housing of the smoke detector (for example, refer to JP 3714926 B).

Further, the smoke detecting device and the intake device are accommodated in the same space as a control board (control device) (for example, refer to JP 3714926 B).

SUMMARY OF THE INVENTION

In the related art, if the housing or the door is deflected when opening/closing the door of the housing, the members configuring the lock mechanism shift with respect to each other, and hence the housing and the door may not perfectly fit into each other. Thus, deformation and damage occur as a result of the application of an excessive force on the lock mechanism itself over a long period of time, and troubles may arise in opening/closing the door. In recent years, in particular, such problem is a great concern because lighter weight of the fire control panel and the like is being required, and a housing made of deflectable resin material is used.

In view of such situation, a first object of the present invention is to provide an electric device which is free from troubles in opening/closing the cover even if the housing is distorted.

In the related art, the smoke detecting device section and the intake device section are communicated through an intermediation of the long piping in the housing of the smoke detector, and are arranged spaced apart from each other in the housing, and thus a long piping and distance are necessary between the smoke detecting device section and the intake device section, whereby a piping component cost cannot be reduced and the housing of the smoke detector cannot be miniaturized.

In view of such situation, a second object of the present invention is to provide a smoke detector in which reduction in piping component cost can be achieved and the housing can be miniaturized.

In the related art, the smoke detecting device section and the intake device section are accommodated in the same space as the control board within the housing of the smoke detector, and a partition and the like is not provided therebetween, and thus, while the smoke detector is driving, the heat from a power supply unit of the control board may be transmitted to the smoke detecting device and the intake device or the vibration of the intake device may transmit to the control board, thereby adversely affecting each other. The intake device has an exhaust port formed on the side wall of the housing of the smoke detector, but when impact by external force is applied on the housing, such impact is transmitted to the intake device or the smoke detecting device through the piping component, thereby adversely affecting the devices in some cases.

In view of such situation, a third object of the present invention is to provide a smoke detector in which heat, vibration, and the like are hard to be transmitted between the smoke detecting device, the intake device, and the control board, or impact and the like applied on the housing is hard to be transmitted to the smoke detecting device and the intake device.

According to a first aspect of the present invention, an electric device, includes:

a case having a substantially box shape and an opened end surface;

a cover including a lid surface for covering the end surface of the case;

a hinge arranged between the case and the cover, for opening/closing the case and the cover; and an engagement section for holding a closed state of the case and the cover, in which the engagement section includes:

an engaged portion arranged in the case and includes
   a shaft member having a shaft portion substantially orthogonal to an inner surface of the case, and
   a bearing member for fixing the shaft member with a distal end thereof projecting from a guide hole end surface of a shaft member pushing portion; and an engaging portion including
   a coupling component provided with an attachment piece to be attached to the cover, and
   a substantially horseshoe shaped portion for communicating a cutout of substantially long hole shape in connection to an end of the attachment piece. Further, an inner surface on a front end side of the substantially horseshoe shaped portion and the guide hole end surface, and an outer surface on a back end side of the substantially horseshoe shaped portion and the inner surface of the case are respectively combined when a lid is closed, and the engaged portion is caused to pass through the cutout so that fitting therebetween is performed.

According to a second aspect of the present invention, a smoke detector includes a substantially box-shaped housing which includes:

a fan for taking in sampling air from a sampling tube; and a smoke detection unit for introducing the sampling air from the sampling tube, in which an accommodation chamber in which the fan and the smoke detection unit are arranged in proximity to each other at different levels one above the other (i.e. the accommodation chamber has a two-story structure) is arranged in the housing.

Further, the present invention is the smoke detector, in which the accommodation chamber is sealed by a lid body.

According to a third aspect of the present invention, a smoke detector includes a substantially box-shaped housing which includes:

a fan for taking in sampling air from a sampling tube; and a smoke detection unit for introducing the sampling air from the sampling tube, in which:

an accommodation chamber for accommodating one of the fan and the smoke detection unit is arranged in the housing; and a side wall of the accommodation chamber lined with a circuit board accommodating section of the housing at a predetermined gap therefrom has a dual structure (i.e. the lateral has a double wall structure).

Further, the present invention is the smoke detector, in which the side wall of the housing has a dual structure.

According to the present invention, the substantially horseshoe shaped portion of the coupling component corrects the deflection of the case when the cover is closed, whereby the positional relationship of the case and the cover is always maintained to be constant, and hence the opening/closing of the cover is reliably performed. Therefore, each component is prevented from being damaged or deformed, and hence the cover can be smoothly opened/closed.

According to the present invention, the fan and the smoke detection unit are arranged proximately to each other at different levels one above the other in the accommodation chamber arranged in the housing, whereby it is possible to reduce the piping component for connecting the fan and the smoke detection unit, and thus the cost of the piping component can be reduced and the assembly cost can be reduced, and further, the distance between the fan and the smoke detection unit can be reduced to thereby miniaturize the housing.

According to the present invention, the fan or the smoke detection unit and the circuit (control) board accommodating section are partitioned by a side wall of dual structure of the accommodation chamber, and thus heat from the power supply unit of the control board is less likely to be transmitted to the smoke detection unit and the fan, thereby preventing the light source in the smoke detection unit, the rotary vane of the fan, and the like from being damaged by heat, or the vibration of the fan is less likely to be transmitted to the control board, thereby preventing the control board from malfunctioning by vibration. Further, the side wall of the housing has a dual-structure, and hence the impact is less likely to be transmitted to the fan and the smoke detection unit even if external force is applied on the side wall of the housing, and the fan and the smoke detection unit are prevented from being damaged by the impact.

DETAILED DESCRIPTION OF THE PREFERRED EMBODIMENTS

Figure 1:
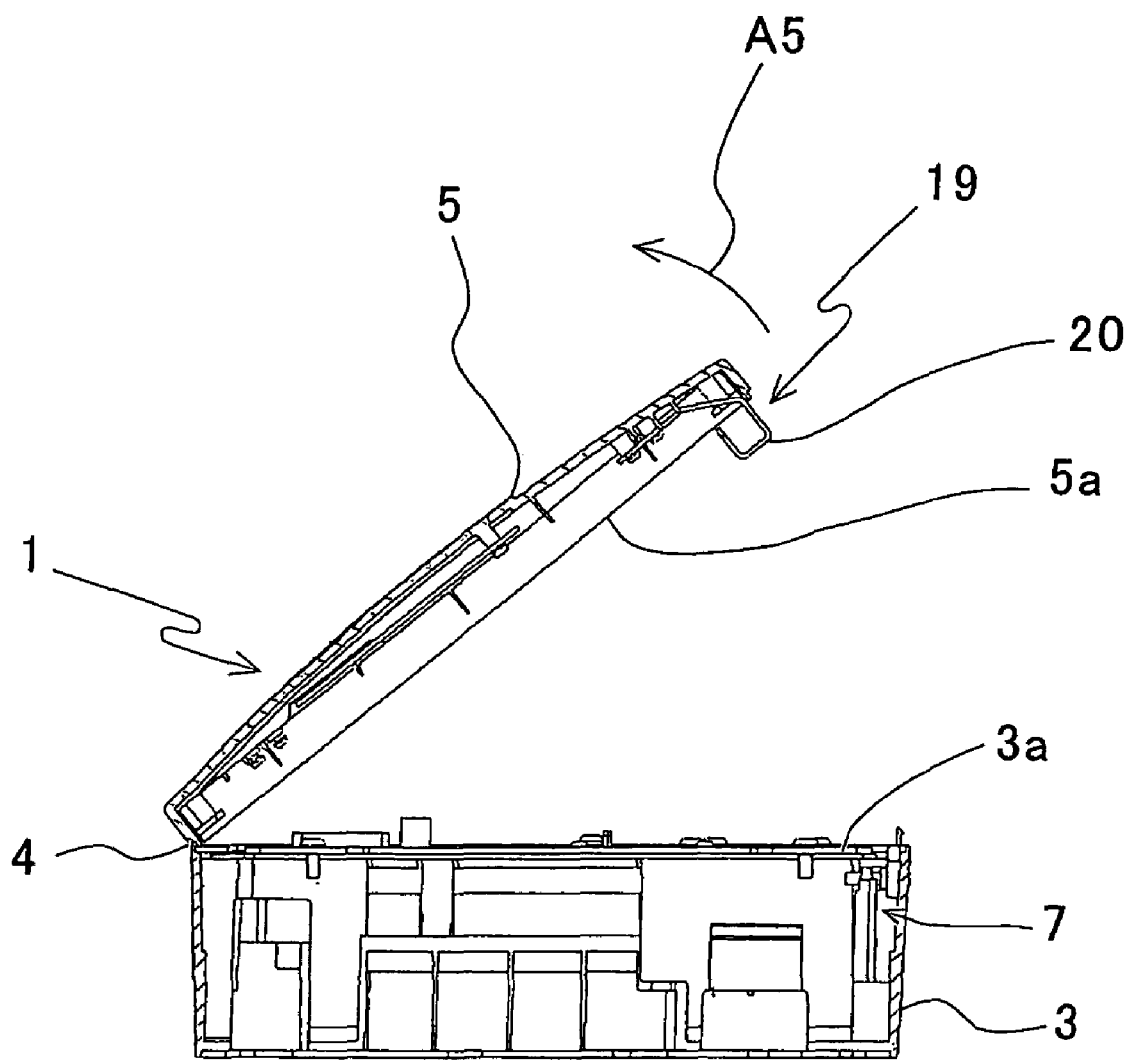
FIG. 1 is a front view illustrating a first embodiment of the present invention.
Figure 2:
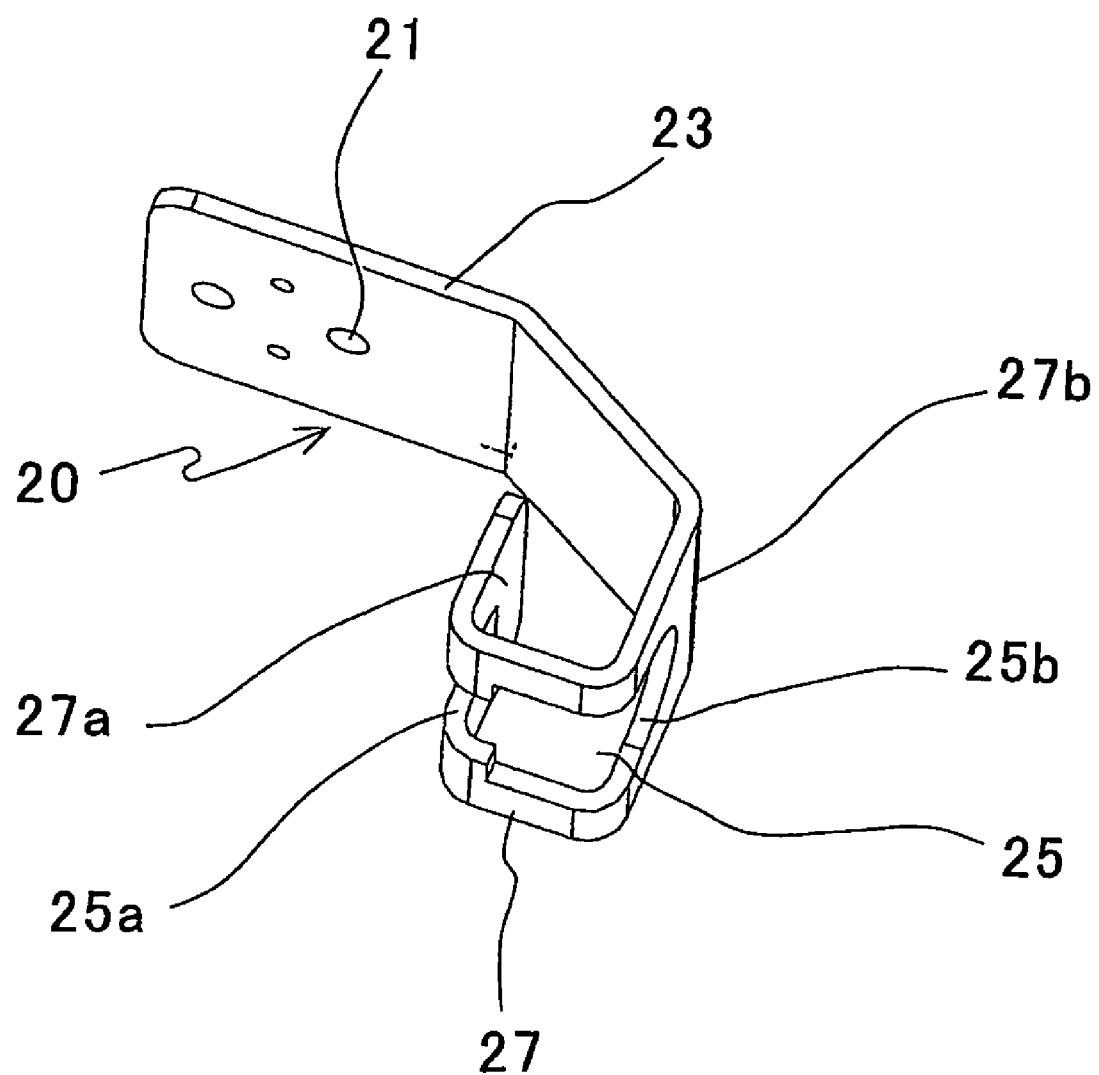
FIG. 2 is an enlarged perspective view of a coupling component.
Figure 3:
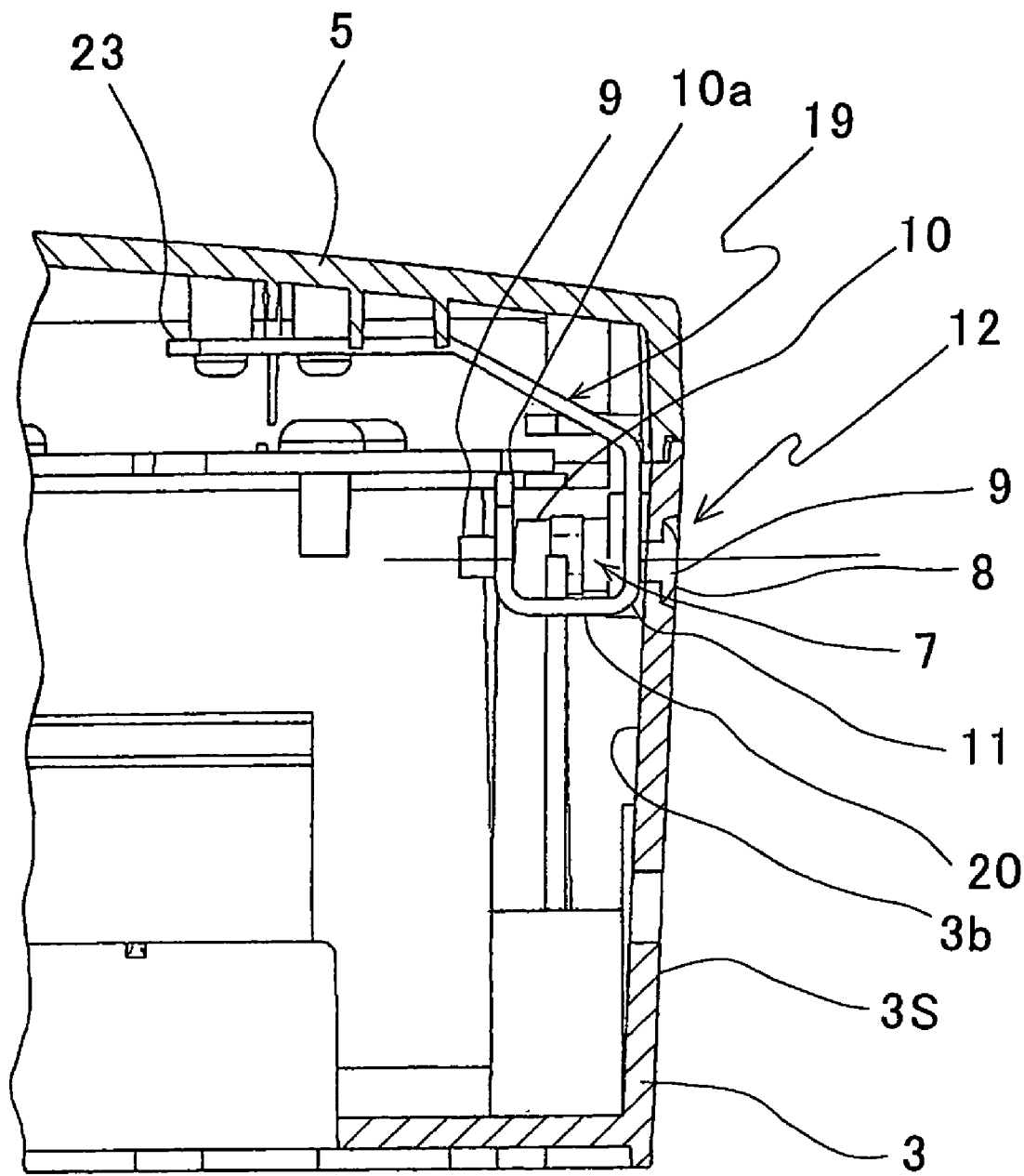
FIG. 3 is an enlarged view of the main parts illustrating a lid closed state of the cover.

A first embodiment of the present invention is described with reference to FIGS. 1 to 4.

An electric device such as a fire control panel 1 includes a case (housing) 3, a cover (lid body) 5 coupled to the case 4 through an intermediation of a hinge 4, and an engagement section 12 serving as a lock mechanism. The engagement section 12 includes an engaging portion 19 and an engaged portion 7.

The case 3 made of resin material has a substantially box-shape and has an opened end surface 3a. The engaged portion 7 is arranged on the case 3. The engaged portion 7 includes a through-hole 8 perforated at a side surface 3s of the case 3, a shaft member such as a screw 9 inserted to the through-hole 8 from an outer side, a bearing member such as a nut 11 screw-fitted to the screw 9, and a shaft member pushing portion 10 having a guide hole (not shown) into which a distal end side of the screw 9 is inserted. The screw 9 is inserted so as to be orthogonal to the inner surface 3b of the case 3, and the nut 11 fixes the screw 9 with the distal end 9a of the screw 9 projecting out from a guide hole end surface 10a of the shaft member pushing portion 10.

The cover 5 includes a lid surface 5a that covers the end surface 3a of the case 3. The cover 5 is provided with the engaging portion 19 that engages the engaged portion 7, and a coupling component 20 is used as the engaging portion 19. The coupling component 20 has a cross-section of a substantially d-shape, and includes an attachment piece 23 having an attachment hole 21, and a substantially horseshoe shaped portion 27 for communicating a cutout 25 of substantially long hole shape in connection to the end of the attachment piece 23. A long hole 25a at the distal end side of the cutout 25 is formed to have a size capable of closely attaching to and fitting to the screw portion of the screw 9, or a long hole 25b at the back end side is formed to a size of closely attaching and fitting the nut 11. Thus, the backlash in the radial direction of the screw 9 can be eliminated.

In the first embodiment, when the cover 5 is closed (when lid closed), the front end side inner surface 27a of the substantially horseshoe shaped portion 27 and the guide hole end surface 10a, and the back end side outer surface 27b and the inner surface 3b of the case 3 are respectively combined, and allows the cutout 25 to pass (fit and hold) the engaged portion 7.

The operation according to the first embodiment is described.

Figure 4:
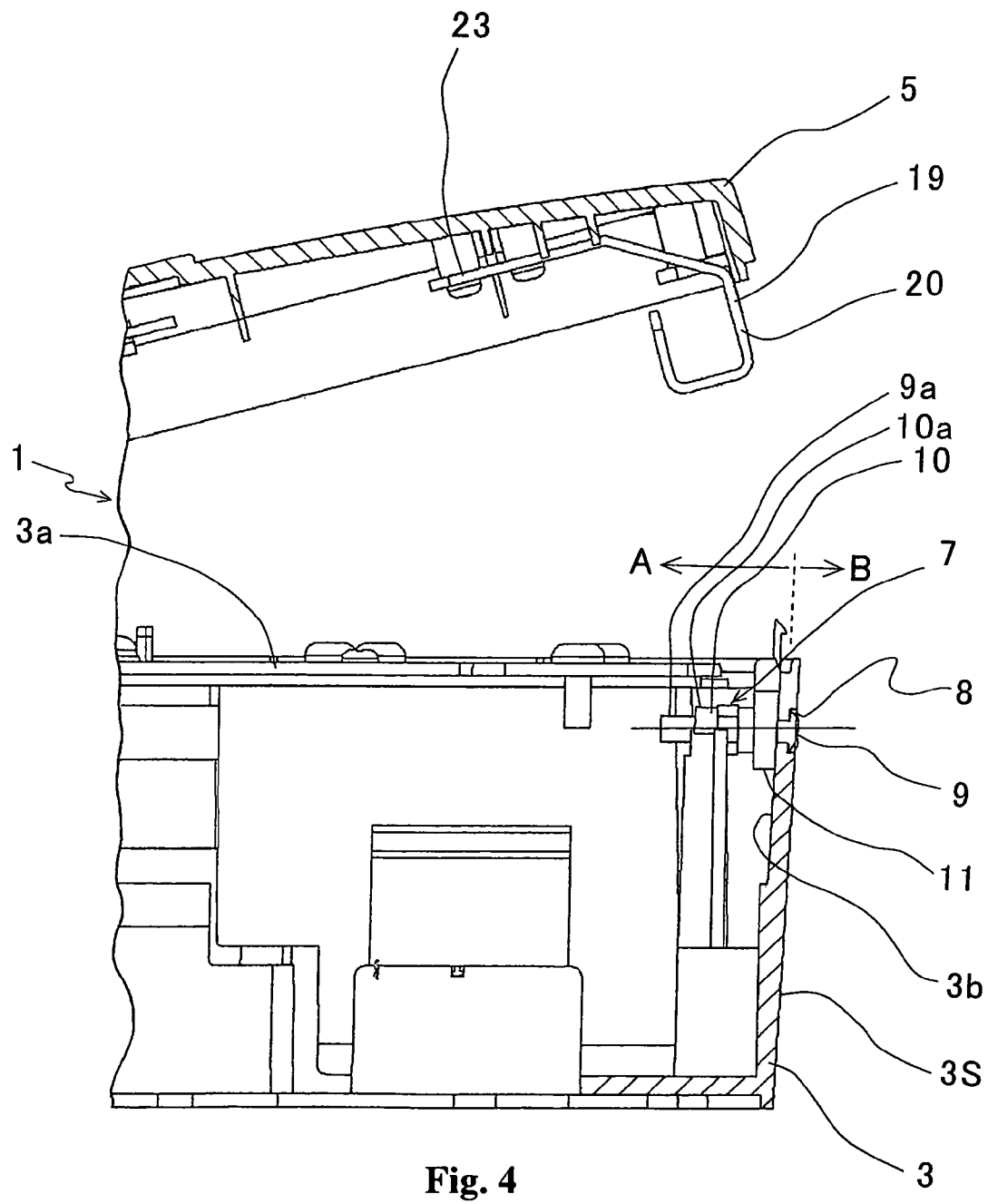
FIG. 4 is an enlarged view of the main parts illustrating a lid opened state of the cover.

When the cover 5 is lifted and turned in the direction of arrow A5 in the lid closed state, the coupling component 20 of the engaging portion separates, as illustrated in FIGS. 1 and 4, from the screw 9 of the engaged portion 7, whereby the fitting (engagement) of the coupling component 20 and the screw 9 are released to enter a lid opened state, thereby exposing the accommodating components of the case 3. In this case, the cover 5 is supported by the case 3 through an intermediation of the hinge 4, and thus the cover 5 and the case 3 do not separate from each other.

When the cover 5 is turned in the opposite direction from the above, the coupling component 20 of the engaging portion 19 gradually approaches the screw 9 of the engaged portion 7, and the cutout 25 fits into and fixes to the screw 9. In this case, the front end side inner surface 27a of the substantially horseshoe shaped portion 27 of the coupling component 20 and the guide hole end surface 10a, and the back end side outer surface 27b and the inner surface 3b of the case 3 are respectively combined, and the engaged portion 7 is passed (fitted and held) at the cutout 25.

As with the case 3 of the electric device according to the first embodiment, in a large and thin box, the vicinity of the end of each side surface generally tends to deflect inward. In particular, the above-mentioned tendency is larger at the portion closer to the center of the side surface. The resin material have a strength lower than the metal material, and influence of molding condition and temperature change also needs to be taken into consideration. Therefore, when the cover 5 is opened, the side surface 3s of the case 3 tends to deflect in the direction of the arrow A.

When the cover 5 is closed, the curved portion of the side of the back end side outer surface 27b of the substantially horseshoe shaped portion 27 of the coupling component 20 pushes the inner surface 3b of the case 3 in the direction of the arrow B while sliding to smoothly fit therein. That is, the deflection of the side surface 3s of the case 3 is returned to the original state when closed.

Therefore, the substantially horseshoe shaped portion 27 of the coupling component 20 corrects the deflection in the direction of the arrow A of the side surface 3s of the case 3 when the cover 5 is closed, whereby the positional relationship of the case 3 and the cover 5 is always maintained to be constant and hence the opening/closing of the cover 5 is reliably performed.

The embodiment of the present invention is not limited to the above, and for example, the engagement section may be arranged at two or more positions.

Instead of using a nut as the bearing member, a female screw may be cut in the guide hole of the shaft member pushing portion 10 to thereby screw-attach the screw 9 thereto.

Further, the shaft member merely needs to have the shaft portion substantially orthogonal to the inner surface 3b of the case 3, and hence a parallel pin and the like may be press-fitted up to the inner surface 3b from the guide hole. In this case, the shaft member cannot be seen at the side surface 3s of the case 3, and thus satisfactory outer appearance is obtained.

Figure 5:
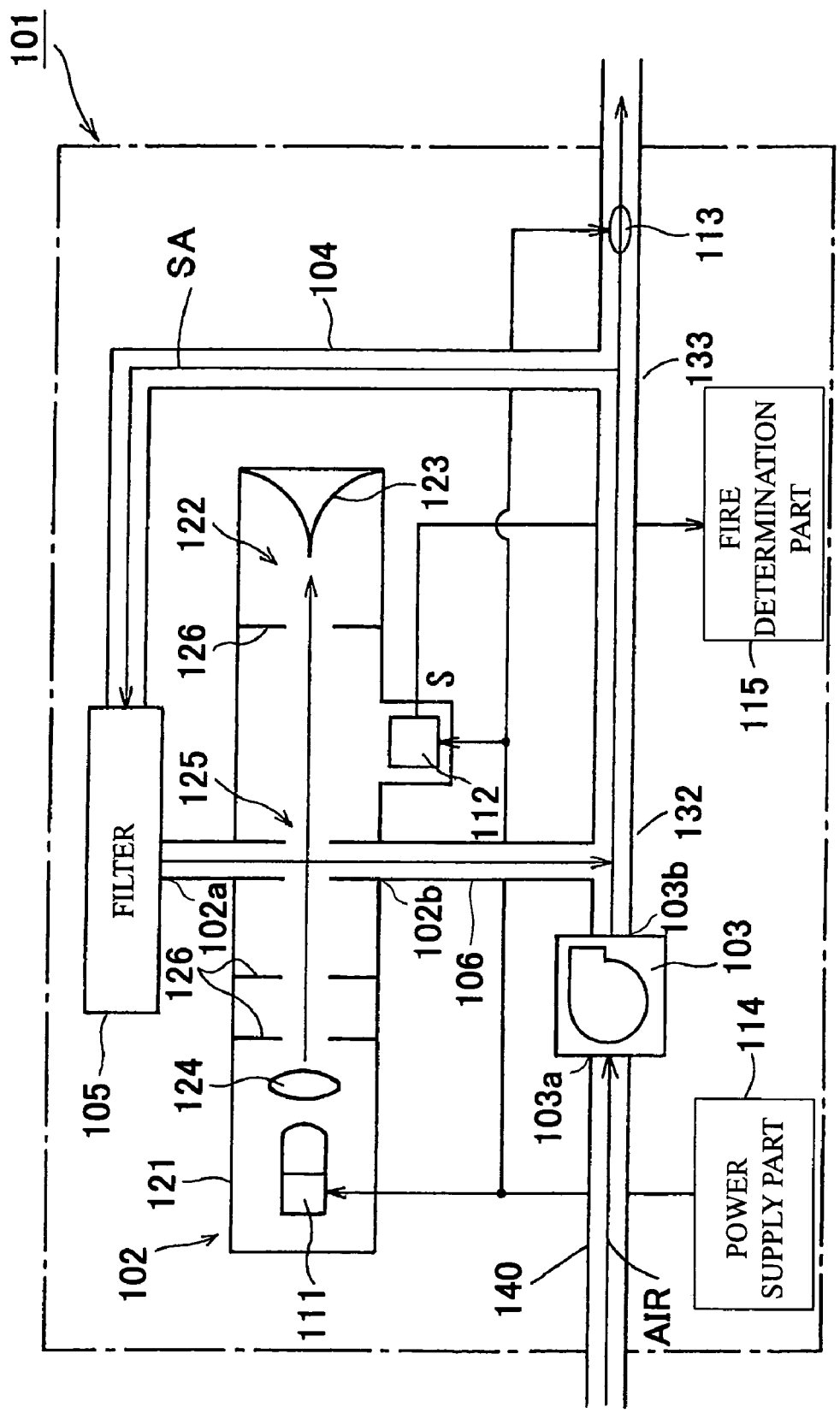
FIG. 5 is an explanatory view illustrating the main configurations of the smoke detector, illustrating an embodiment of the smoke detector of the present invention.
Figure 6:
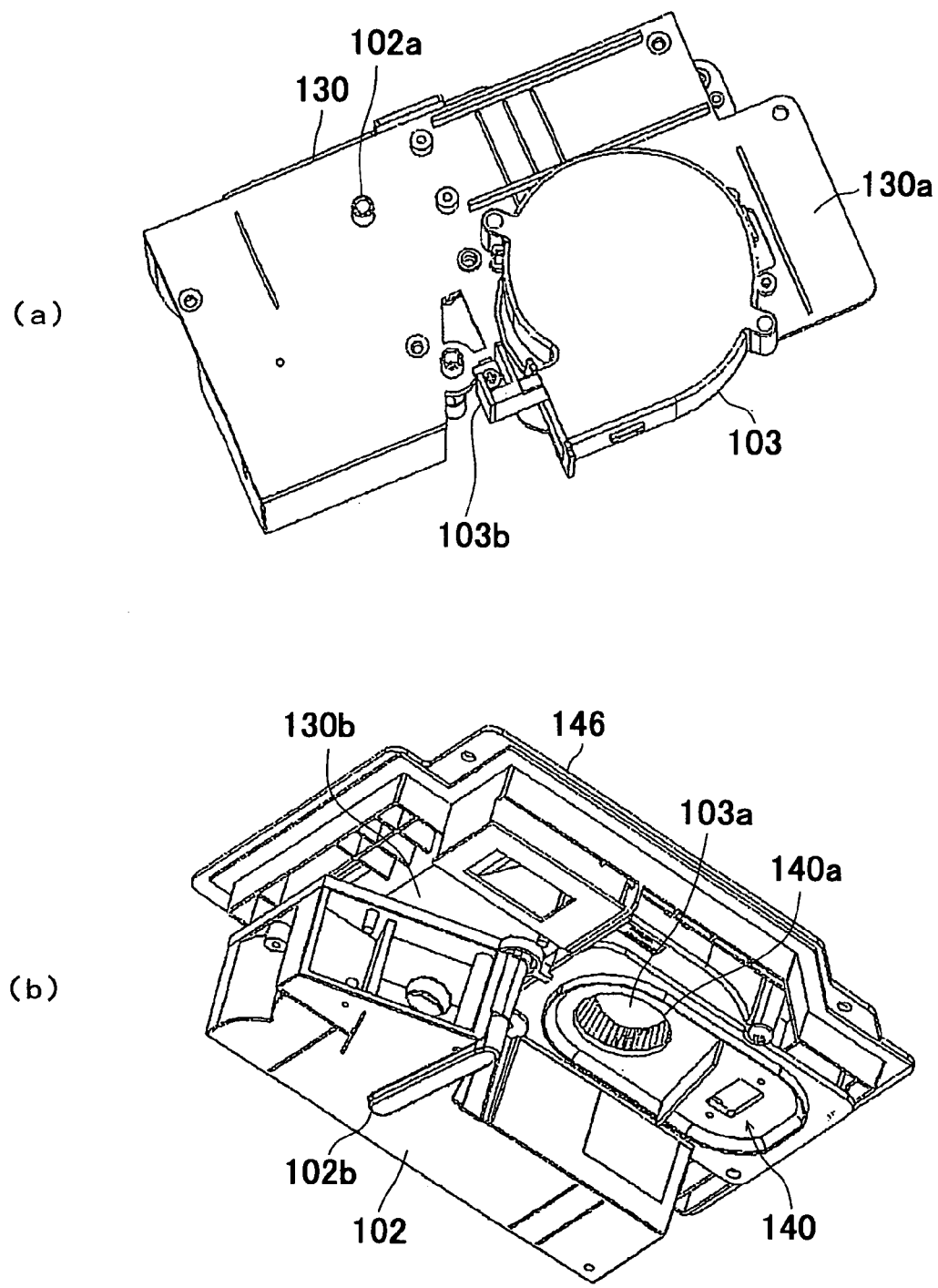
FIG. 6 are explanatory views illustrating the same as above, and perspective views of the main parts in a state in which a fan and a smoke detection unit in the smoke detector are assembled, where part (a) illustrates upper surface side, part (b) illustrates lower surface side.
Figure 7:
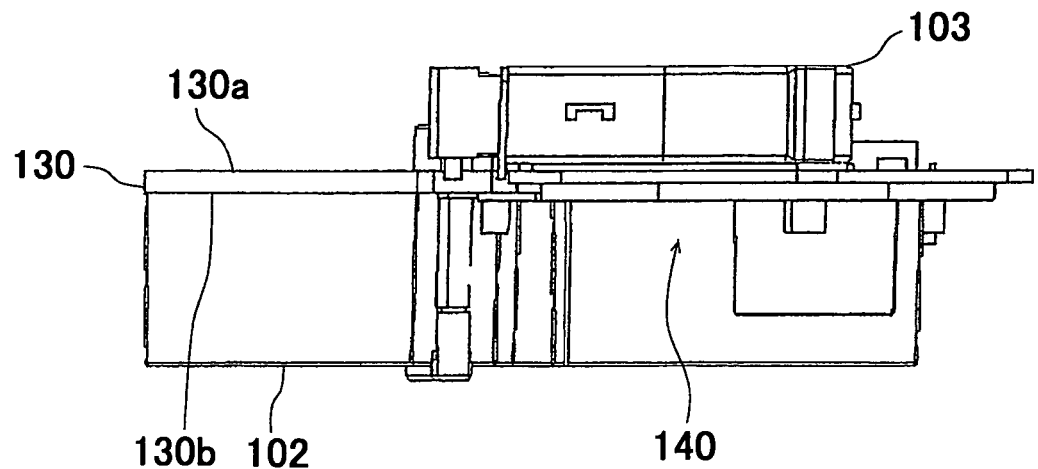
FIG. 7 is an explanatory view illustrating the same as above, and a side view in the above-mentioned state.
Figure 8:
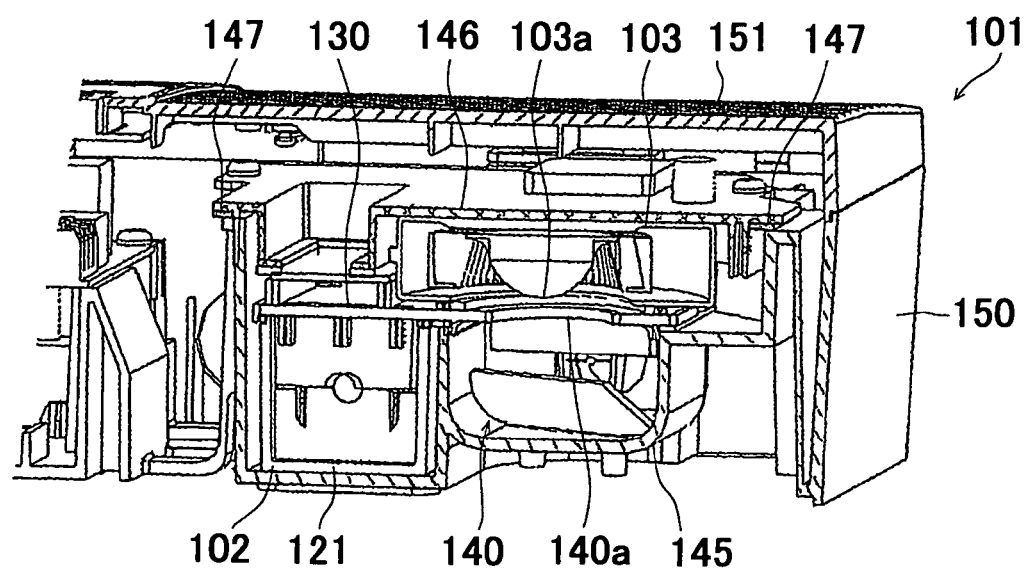
FIG. 8 is an explanatory view illustrating the same as above, and a cross-sectional view in a state in which the fan and the smoke detection unit are assembled and accommodated in the housing.

A second embodiment of the present invention is described with reference to FIGS. 5 to 8. FIG. 5 is an explanatory view illustrating the main configurations of the smoke detector of the present invention, FIG. 6 is a perspective view of the main parts in a state in which a fan and a smoke detection unit are assembled (part (a) illustrates upper surface side, and part (b) illustrates lower surface side), FIG. 7 is a side view in the above-mentioned state, and FIG. 8 is a cross-sectional view in a state in which the fan and the smoke detection unit are assembled and accommodated in the housing.

As illustrated in FIG. 5, a smoke detector 101 includes a smoke detection unit 102 having a dark box 121, a fan 103 for feeding air to the smoke detection unit 102 as sampling air SA to be detected, which flows in from a piping for sampling (not shown) disposed in a monitoring zone through an intermediation of a flow-in section 140, a light emitting element 111 disposed within the smoke detection unit 102, a light receiving element 112 such as a photodiode, an air flow sensor 113 for measuring the flow rate of the air and the fan 103, a power supply part 114 for supplying a power to the air flow sensor 113 the light receiving element 112, and the like, and a fire determination part 115 connected to the light receiving element 112. The introduction path 104 branches at the flow path branching portion 133 from the secondary side of the fan 103, and a reflux path 106 for refluxing the sampling air SA from the smoke detection unit 102 merges at a flow path merging portion 132 on the secondary side of the fan 103, whereby the sampling air SA is passed through the introduction path 104, filtered at the filter 105, passed through the smoke detection unit 102, and refluxed from the reflux path 106 to the secondary side of the fan 103 due to the differential pressure generated between the flow path merging portion 132 and the flow path branching portion 133 (flow rate at the flow path merging portion 132 is set faster than the flow rate at the flow path branching portion 133 to generate a differential pressure between the flow path merging portion 132 and the flow path branching portion 133, and for example, the flow path merging portion 132 may be arranged at a position close to the peripheral edge of a rotary vane of the fan 103 and the flow path branching portion 133 may be arranged at a position distant from the peripheral edge of the rotary vane to generate a differential pressure between the flow path merging portion 132 and the flow path branching portion 133).

A smoke detecting portion 125 is disposed in the center of the dark box 121 of the smoke detection unit 102, and the sampling air SA that has passed through the smoke detecting portion 125, and an optical detection is performed at the time. Note that, reference numeral 123 denotes a light trap provided to a light shielding part 122, reference numeral 124 denotes a condenser lens, and reference numeral 126 denotes an aperture.

The fire determination part 115 includes an amplifier circuit for amplifying an output signal S of the light receiving element 112, an A/D converter for converting a level of the amplifier circuit into a detection level, a comparator circuit for determining that fire occurs when the detection level becomes equal to or higher than a predetermined threshold value, and the like.

In FIG. 5, the fan 103 and the smoke detection unit 102 are illustrated to be spaced apart from each other for the sake of description, but actually, as illustrated in FIGS. 6 to 8, the fan 103 and the smoke detection unit 102 are arranged close to each other while partially overlapping one above the other, and arranged at different levels.

Specifically, as illustrated in FIGS. 6 and 7, the fan 103 is attached to an upper surface 130a of a mount 130, and a substantially L-shaped smoke detection unit 102 is attached to a lower surface 130b of the mount 130, where the fan 103 and the smoke detection unit 102 are arranged close to each other while partially overlapping one above the other through an intermediation of the mount 130, and arranged at different levels of two levels in the up and down direction. The fan 103 and the smoke detection unit 102 are partially overlapped one above the other, but are arranged so as not to overlap at a position of an intake port 103a at the center of the fan 103, and a flow-in section 140 is arranged adjacent to the side of the smoke detection unit 102 at a position overlapping in the up and down direction with the intake port 103a of the fan 103 through an intermediation of the mount 130. The flow-in section 140 is provided with an opening 140a passing through the mount 130, facing the intake port 103a of the fan 103, and communicating the flow-in section 140 and the intake port 103a.

As illustrated in FIG. 8, the smoke detection unit 102 and the fan 103 arranged on the mount 130 are accommodated at an arrangement described above in an accommodation chamber 145 integrally formed with the housing 150. An upper opening of the accommodation chamber 145 is sealed with an accommodation chamber cover (lid body) 146 through an intermediation of a packing 47, and an upper opening of the housing 150 is blocked by a freely openable/closable housing cover 151. The flow-in section 140 arranged adjacent to the smoke detection unit 102 is formed to have a tubular shape by part of the accommodation chamber 145 covering the flow-in section 140 from the lower side.

The air from the sampling tube (not shown) disposed in the monitoring zone is taken in by the fan 103 through the flow-in section 140, part of the air exhausted from the exhaust port 103b of the fan 103 is branched, passed through a smoke detecting portion 125 within the dark box 121 through the flow-in port 102a and the flow-out port 102b of the smoke detection unit 102 as the sampling air SA, optically smoke detected therein, and then refluxed to the secondary side of the fan 103. The exhaust port 103b of the fan 103 is connected to an exhaust tube (not shown) for exhausting the sampling air to the outside of the housing 15.

A specific method for miniaturizing the housing 150 is described. First, the flow-in section 140 leading to the intake port 103a of the fan 103 is arranged in the gap on the side of the substantially L-shaped smoke detection unit 102. The mount 130 serves as both the cover of the smoke detection unit 102 and the lid of the intake portion of the fan 103. Further, the flow-in port 102a and the flow-out port 102b of the smoke detection unit 102 are at positions close to the exhaust port 103b of the fan 103. Thus, the total length of the piping necessary from the exhaust port 103b of the fan 103 to the flow path branching portion 133, from the flow path branching portion 133 to the flow-in port 102a of the smoke detection unit 102, and from the flow-out port 102b of the smoke detection unit 102 to the flow path merging portion 132 merely needs to be about 200 mm. The space required for the accommodation chamber 145 thus merely needs to be about 140 to 160 mm vertically, 100 to 120 mm horizontally, and about 50 to 70 mm in height, whereby the housing 150 can be sufficiently miniaturized.

Similar to the above, in the smoke detector 101 of the present invention, the smoke detection unit 102 and the fan 103 can be accommodated close to each other at different levels while partially overlapping one above the other in the accommodation chamber 145 of the housing 150, whereby the piping components between the smoke detection unit 102 and the fan 103 can be shortened, and hence the housing 150 can be miniaturized.

The accommodation chamber 145 is sealed by the plate-shaped packing 147 when attaching the accommodation chamber cover (lid body) 146 and thus is not immersed by water. Further, lower cost of the components is realized because the waterproof mechanism does not need to be arranged in the smoke detection unit 102 and the fan 103, respectively.

There has been described a case where the smoke detector 101 of the present invention has the fan 103 and the smoke detection unit 102 arranged close to each other one above the other while arranging the fan 103 on the upstream side of the smoke detection unit 102, but the fan 103 and the smoke detection unit 102 may be arranged one above the other while arranging the fan 103 on the downstream side of the smoke detection unit 102.

Figure 9:
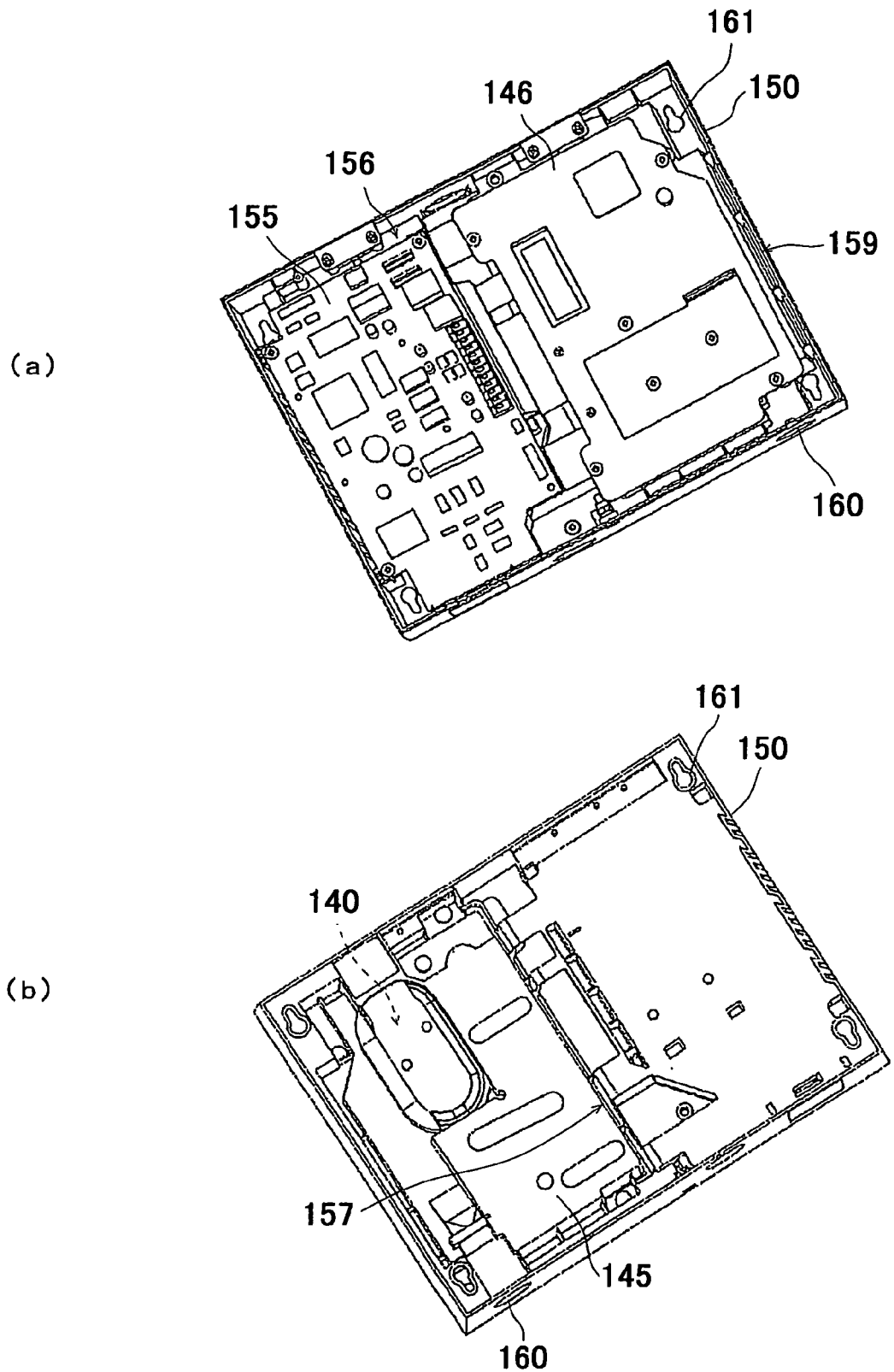
FIG. 9 are explanatory views illustrating the same as above, and perspective views of a housing of the smoke detector, where part (a) illustrates the upper surface side, and part (b) illustrates the lower surface side.
Figure 10:
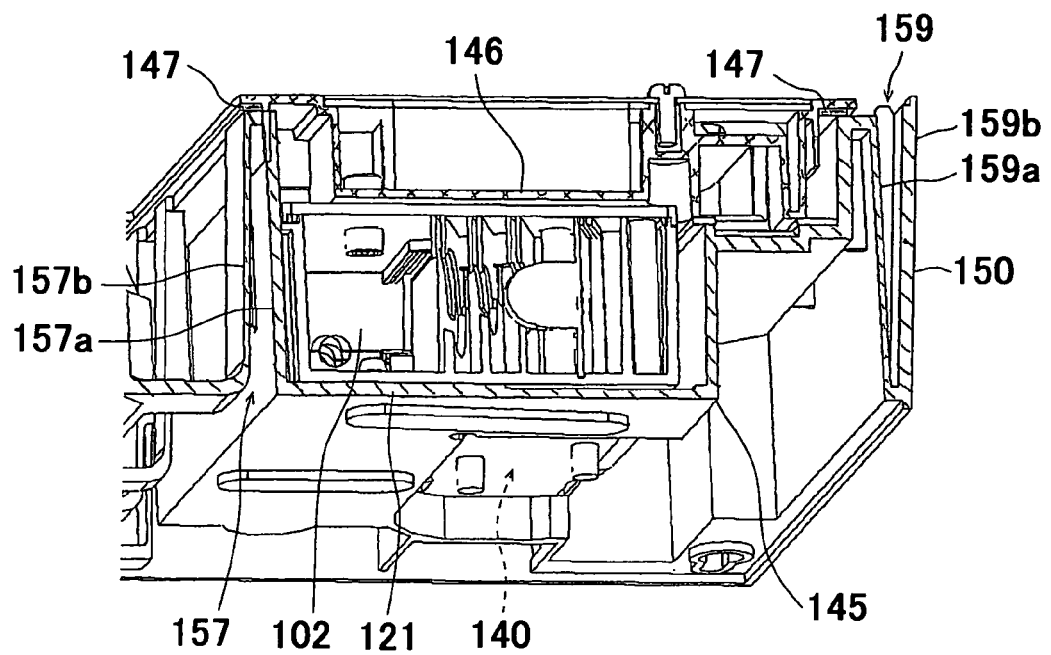
FIG. 10 is an explanatory view illustrating the same as above, and a cross-sectional view of the housing of the smoke detector.
Figure 11:
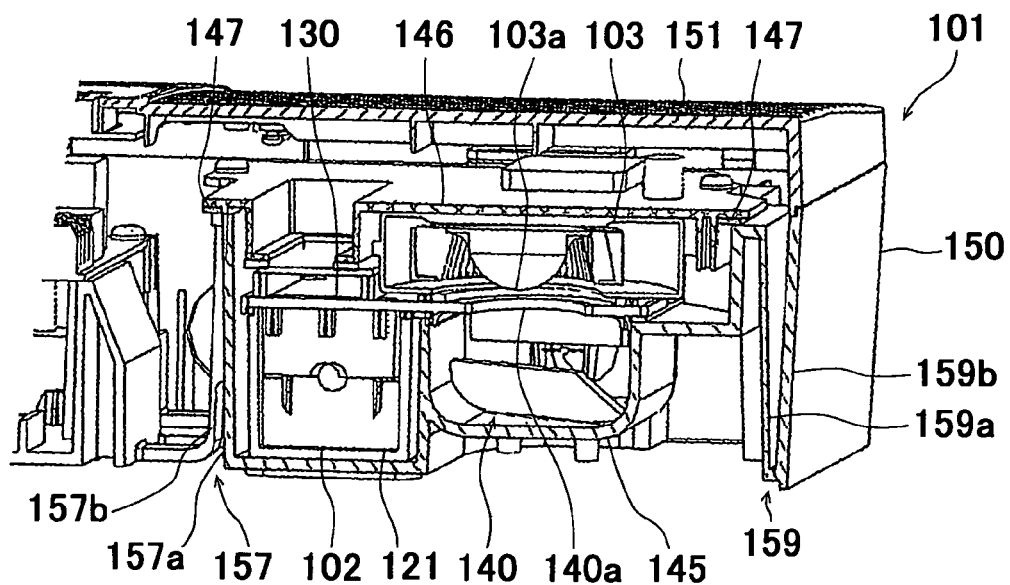
FIG. 11 is an explanatory view illustrating the same as above, and a cross-sectional view of a cross-section different from FIG. 10 in a state in which the cover is attached to the housing of the smoke detector.

A third embodiment of the present invention is described based on FIGS. 9 to 11. FIG. 9 is a perspective view of a housing of the smoke detector of the present invention (part (a) illustrates the upper surface side, part (b) illustrates the lower surface side), and FIG. 10 is a cross-sectional view of the housing. FIG. 11 is a cross-sectional view of a cross-section different from FIG. 10.

As illustrated in FIGS. 9 to 11, the accommodation chamber 145 for accommodating the fan 103 and the smoke detection unit 102 has a side wall 157, which is lined at a predetermined gap from a control board accommodating section 156 of the control board 155, formed as a side wall of dual structure of an inner wall 157a and an outer wall 157b. In the third embodiment, a side wall 159 of the housing 150 on the side opposite to the side wall 157 of dual structure of the accommodation chamber 145 is also a side wall of dual structure of an inner wall 159a and an outer wall 159b. The accommodation chamber 145 is integrally formed with the housing 150, and the side wall 157 of dual structure of the accommodation chamber 145 and the side wall 159 of dual structure of the housing 150 are formed as an integrated member.

The side wall including flow-in section 140 and the exhaust port 160 also has a similar configuration.

The upper opening of the accommodation chamber 145 is sealed with the accommodation chamber cover (lid body) 146 through an intermediation of the packing 147, and the upper opening of the housing 150 is blocked by the freely openable/closable housing cover 151. The flow-in section 140 arranged adjacent to the smoke detection unit 102 is formed to have a tubular shape by part of the accommodation chamber 145 covering the flow-in section 140 from the lower side.

The air from the sampling tube (not shown) disposed in the monitoring zone is taken in by the fan 103 through the flow-in section 140, part of which air is branched, passed through the smoke detecting portion 125 within the dark box 121 through the flow-in port and the flow-out port (not shown) of the smoke detection unit 102 as the sampling air SA, optically smoke detected therein, and then refluxed to the secondary side of the fan 103.

The secondary side of the fan 103 is connected to the exhaust port 160 for exhausting the sampling air to the outside of the housing 150.

In the smoke detector 101 of the present invention, the fan 103, the smoke detection unit 102, and the control board accommodation section 156 are partitioned by the side wall 157 of dual structure of the accommodation chamber 145, and thus the heat from the power supply unit of the control board 155 is less likely to be transmitted to the smoke detection unit 102 and the fan 103, thereby preventing the light source in the smoke detection unit 102, the rotary vane of the fan 103, and the like from being damaged by heat, or the vibration of the fan 103 is less likely to be transmitted to the control board 155, thereby preventing the control board 155 from malfunctioning by vibration. Further, as the side wall 159 of the housing 150 has a dual-structure, the impact is less likely to be transmitted to the fan 103 and the smoke detection unit 102 even if external force is applied on the side wall 159 of the housing 150, and the fan 103 and the smoke detection unit 102 are prevented from being damaged by the impact.

Only the side wall 157 of the four outer walls of dual structure partitions the control board accommodating section

156 in the housing 150, and the remaining outer walls of dual structure also serves as the peripheral walls of the housing 150 so that the housing 150 can be miniaturized and the smoke detection unit 102, the fan 103, and the control board 155 are less likely to interfere with each other as they are partitioned only in one direction. Moreover, by forming the attachment hole 161 of four corners of the housing 150 at the outer side of the outer wall of dual structure, if distortion occurs at the wall surface after installation, the outer wall of the housing 150 may distort but the inner wall does not distort, and thus the fan 103 and the smoke detection unit 102 are prevented from being damaged.

What is claimed is:

1. An electric device, comprising:
   a case having a substantially box shape and an opened end surface;
   a cover including a lid surface for covering the end surface of the case;
   a hinge, arranged between the case and the cover, for opening/closing the case and the cover; and
   an engagement section for holding a closed state of the case and the cover, wherein the engagement section includes:
   (i) an engaged portion arranged in the case and including a shaft member having a shaft portion substantially orthogonal to an inner surface of the case, and a bearing member for fixing the shaft member with a distal end thereof projecting from a guide hole end surface of a shaft member pushing portion; and
   (ii) an engaging portion including a coupling component provided with an attachment piece attached to the cover, and a substantially horseshoe shaped portion connected to an end of the attachment piece and defining an elongated cutout,
   wherein an inner surface on a front end side of the substantially horseshoe shaped portion and the guide hole end surface, and an outer surface on a back end side of the substantially horseshoe shaped portion and the inner surface of the case are respectively combined when a lid is closed; and
   wherein the engaged portion is caused to pass through the cutout so that a long hole at a front end side of the cutout is formed so as to have a size capable of closely attaching to and fitting to the shaft member, and a long hole at the back end side is formed so as to have a size capable of closely attaching and fitting to the bearing member.

* * * * *